(12) United States Patent
Bandara et al.

(10) Patent No.: US 6,184,538 B1
(45) Date of Patent: Feb. 6, 2001

(54) DUAL-BAND QUANTUM-WELL INFRARED SENSING ARRAY HAVING COMMONLY BIASED CONTACT LAYERS

(75) Inventors: Sumith V. Bandara; Sarath D. Gunapala, both of Valencia; John K. Liu, Pasadena, all of CA (US)

(73) Assignee: California Institute of Technology, CA (US)

( * ) Notice: Under 35 U.S.C. 154(b), the term of this patent shall be extended for 0 days.

(21) Appl. No.: 09/173,965

(22) Filed: Oct. 16, 1998

Related U.S. Application Data

(60) Provisional application No. 60/062,434, filed on Oct. 16, 1997.

(51) Int. Cl.$^7$ .................................................. H01L 31/042
(52) U.S. Cl. .......................... 257/21; 257/184; 257/440; 257/443; 257/448; 250/338.4; 250/339.02; 438/54; 438/66; 438/74; 438/94
(58) Field of Search .................................. 257/15, 17, 21, 257/22, 440, 443, 447, 448, 459, 460, 464, 466, 184; 250/338.4, 339.02; 438/54, 57, 66, 67, 74, 94

(56) References Cited

U.S. PATENT DOCUMENTS

| | | |
|---|---|---|
| 5,023,685 * | 6/1991 | Bethea et al. .......................... 357/30 |
| 5,198,659 | 3/1993 | Smith et al. . |
| 5,384,469 | 1/1995 | Choi . |
| 5,451,767 | 9/1995 | Amano et al. . |
| 5,519,529 * | 5/1996 | Ahearn et al. ......................... 359/248 |
| 5,528,051 | 6/1996 | Nuyen . |
| 5,552,603 | 9/1996 | Stokes . |
| 5,646,395 * | 7/1997 | Miller ................................... 250/214 |
| 5,646,421 * | 7/1997 | Liu ......................................... 257/21 |
| 5,770,866 | 6/1998 | Kim et al. . |
| 6,091,126 * | 7/2000 | Costard et al. ....................... 257/431 |

OTHER PUBLICATIONS

M.Z. Tidrow et al., A high strain two–stack two–color quantum well infrared photodetector *Appl. Phys. Lett.* 70 (7), Feb. 17, (1997).

Gunapala et al., 9–um Cutoff 256 X 256 GaAs/AlxGa1–xAs Quantum Well Infrared Photodetector Hand–Held Camera; Jan. 1997; IEEE vol. 44 No. 1.

Gunapala et al.; 15–um 128X128 GaAs/A1xGa1–xAs Quantum Well Infrared Photodetector Focal Plane Array Camera; Jan. 1997; IEEE vol. 44 No.

\* cited by examiner

*Primary Examiner*—Jerome Jackson, Jr.
*Assistant Examiner*—Bradley W. Baumeister
(74) *Attorney, Agent, or Firm*—Fish & Richardson P.C.

(57) ABSTRACT

Quantum-well sensing arrays for detecting radiation with two or more wavelengths. Each pixel includes at least two different quantum-well sensing stacks that are biased at a common voltage.

20 Claims, 3 Drawing Sheets

DUAL-BAND QUANTUM-WELL INFRARED SENSING ARRAY HAVING COMMONLY BIASED CONTACT LAYERS

This application claims the benefit of U.S. Provisional Application No. 60/062,434, filed on Oct. 16, 1997.

ORIGIN OF THE INVENTION

The invention described herein was made in the performance of work under a NASA contract, and is subject to the provisions of Public Law 96-517 (35 U.S.C. 202) in which the Contractor has elected to retain title.

FIELD OF THE INVENTION

The present invention relates to radiation detection and devices thereof, and more specifically, to a quantum-well radiation sensing array.

BACKGROUND

Quantum-well semiconductor devices can be configured to detect radiation with improved performance compared to many other types of radiation detectors. Unique properties of the quantum-well structures allow for a high quantum efficiency, a low dark current, compact size and other advantages.

In particular, various quantum-well structures can be formed by artificially varying the compositions of lattice matched semiconductor materials to cover a wide range of wavelengths in infrared ("IR") detection and sensing. An intraband transition, that is, photoexcitation of a carrier (i.e., an electron or a hole) between a ground state and an excited state in the same band (i.e., a conduction band or a valance band), can be advantageously used to detect radiation with a high responsivity in the IR range at a selected wavelength by using a proper quantum-well structure biased at a proper voltage. For example, the absorption wavelength of a quantum-well structure formed of $Al_xGa_{1-x}As/GaAs$ can be changed by altering the molar ratio x ($0 \leq x \leq 1$) of aluminum or the thickness of GaAs layer. Other materials for infrared detection include $Hg_{1-x}Cd_xTe$ and $Pb_{1-x}Sn_xTe$. See, for example, Gunapala and Bandara, "Recent Developments in Quantum-Well Infrared Photodetectors," Physics of Thin Films, Vol. 21, pp. 113–237, Academic Press (1995) and a commonly assigned pending Application Ser. No. 08/785, 350 filed on Jan. 17, 1997, which are incorporated herein by reference.

Infrared sensing arrays formed of quantum-well structures are desirable due to their applications in night vision, navigation, flight control, environmental monitoring (e.g., pollutants in atmosphere) and other fields. Many conventional infrared arrays respond to radiation only in a specified wavelength range, such as a short-wavelength infrared range ("SMIR") from about 1 to about 3 $\mu$m, a mid-wavelength infrared range ("MWIR") from about 3 to about 5 $\mu$m, a long-wavelength infrared range ("LWIR") from about 8 to about 12 $\mu$m, or a very-long-wavelength infrared range ("VLWIR") that is greater than about 12 $\mu$m. All sensing pixels in a quantum-well sensing array operating at a specified radiation wavelength are biased at a predetermined voltage. A readout multiplexer having an array of readout pixels corresponding to sensing pixels is usually used to supply this common bias voltage and to read out the signals from the sensing pixels.

A sensing array may have sensing pixels that each include a MWIR detector and a LWIR detector to form a dual-band array. Hence, simultaneous detection of radiation signals can be achieved at two different IR ranges in the same array.

Several dual-color single-element quantum-well detectors have been proposed. Two quantum-well detectors for two different wavelengths can be stacked together to form a single detector for detecting two radiation at two different wavelengths. See, for example, Tidow et al., "A High Strain Two-Stack Two-Color Quantum Well Infrared Photodetector", Applied Physics Letters, Vol. 70, pp. 859–861 (1997) and a commonly assigned pending Application Ser. No. 08/928,292 filed on Sep. 12, 1997, which are incorporated herein by reference. Two different voltages are supplied to the detector to provide proper bias to different quantum-well detectors for substantially optimized responsivities. U.S. Pat. No. 5,552,603 to Stokes discloses a three-color quantum-well sensing array that requires two bias voltages for each sensing pixel.

This requirement of two different bias voltages presents a difficulty in forming a dual-band sensing array. A sensing array requires a multiplexer for readout but most commercial readout multiplexers can only provide a single bias voltage to the sensing pixels. It may be possible to design a special readout multiplexer capable of supplying two voltages. However, this increases the cost of the device. In addition, the need of two voltages complicates the circuitry.

SUMMARY

The present invention provides a quantum-well sensing array capable of simultaneously detecting radiation of two or more different wavelengths. Two or more quantum-well sensing stacks are implemented in each pixel and are biased at a common voltage difference. A readout multiplexer array of a single reference voltage can be coupled to the sensing array and to provide power to and read signals from the sensing array.

One embodiment of such a dual-band quantum will sensing array includes a plurality of sensing pixels. Each sensing pixel has a first semiconductor contact layer doped to have a predetermined type of conductivity, a first quantum-well sensing stack formed over the first semiconductor contact layer and configured to have a plurality of alternating semiconductor layers which form a first number of quantum wells of a first well width, at least one second semiconductor contact layer doped to have the predetermined type of conductivity and formed on the first quantum-well sensing stack, a second quantum-well sensing stack formed over the second semiconductor contact layer and configured to have a plurality of alternating semiconductor layers which form a second number of quantum wells of a second well width, and a third semiconductor contact layer doped to have the predetermined type of conductivity and formed on the second quantum-well sensing stack.

The first and second quantum-well sensing stacks are configured to respond to radiation at first and second operating wavelengths, respectively, to produce charged carriers. The first and third semiconductor contact layers are maintained at a common bias electrical potential with respect to the second semiconductor contact layer so that the first and second quantum-well sensing stacks are biased by a common voltage difference.

The doping level, well width and the number of quantum wells of each quantum-well sensing stack can be configured to substantially maximize the amount of produced charged carriers in responding to each received radiation photon at the respective operating wavelength under the common bias voltage difference. In particular, for a given common bias voltage difference, the doping levels, well widths and the numbers of quantum wells of the two quantum-well stacks can be selected relative to each other so that the amounts of radiation-induced charged carriers in the two stacks are of the same order of magnitude when the intensities of the received radiation energies at the two different wavelengths are different from each other by more than one order of magnitude.

Reflective grating layers or reflecting layers with features on the order of the operating wavelength may be formed on the second and third contact layers to direct normal incident radiation received from the first contact layer back to the first and second sensing stacks at angles to induce absorption of the radiation.

These and other aspects and associated advantages of the present invention will become more apparent in light of the following detailed description, the accompanying drawings, and the claims.

DETAILED DESCRIPTION OF THE PREFERRED EMBODIMENT

Figure 1:
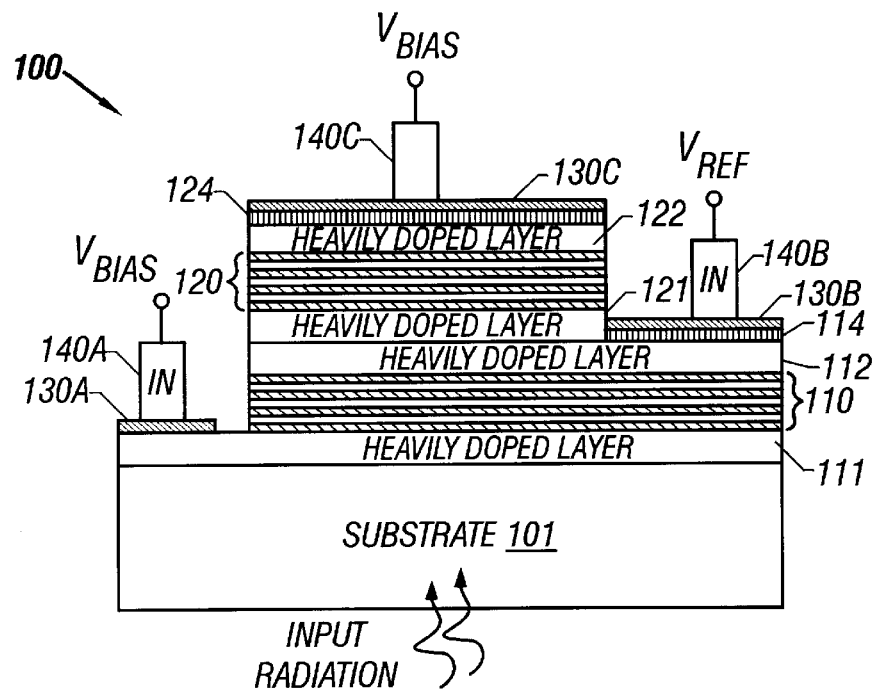
FIG. 1 shows one embodiment of a pixel for a dual-band quantum-well IR sensing array wherein each pixel has two quantum-well IR detectors with different numbers of wells and operates under a single external bias voltage.

FIG. 1 shows one embodiment of a sensing pixel 100 of a dual-band array. A plurality of such pixels form either a one-dimensional array or a two-dimensional array. The pixel 100 includes two quantum-well structures 110 and 120 that are stacked with each other over a semiconductor substrate 101 and are configured to respectively detect radiation of two different wavelengths. The first quantum-well stack 110 has a first number, $N_1$, of quantum wells. The stack 110 absorbs radiation at a first wavelength $\lambda_1$ while transmitting radiation at other wavelengths.

The second quantum-well stack 120 has a second number, $N_2$, of quantum wells. The stack 120 absorbs radiation at a second wavelength $\lambda_2$ while transmitting radiation at other wavelengths. Hence, each quantum-well stack transmits the non-absorbed radiation, rather than blocking. The transmitted radiation by one stack is detectable by another stack.

The two quantum-well stacks 110 and 120 may be formed of the same semiconductor compounds with different molar ratios of a particular element. For example, AlGaAs (barrier)/GaAs(active layer) can be used to form both stacks 110 and 120 but the molar ratios of aluminum are different so that the absorption wavelengths are different. In addition, the quantum-well stacks 110 and 120 may be formed of different semiconductor compounds, particularly, when the first and second wavelengths are significantly different from each other. For example, the first stack 110 may use $Al_xGa_{1-x}As/GaAs$ and the second stack 120 may use $Al_{1-x}Ga_{1-x}As/In_yGa_{1-y}As/GaAs$ or other material combinations such as $Ga_xIn_{1-x}P/InP$. Other material combinations include, GaAs, InP, $Al_xIn_{1-x}P/InP$ and $In_xAl_{1-x}As/AlAs$.

Each quantum-well stack is sandwiched between two heavily doped semiconductor contact layers that are electrically conductive (e.g., $n \approx 10^{17}$ cm$^{-3}$). A proper bias voltage is applied to the quantum-well stack via the contact layers. Dopant types of both contact layers are the same. Hence, if a contact layer on one side of the quantum-well stack is doped to have the n-type conductivity, the contact layer on the other side of the quantum-well stack should also have the n-type conductivity. More specifically, the first quantum-well stack 110 is formed between the contact layers 111 and 112 and the second quantum-well stack 120 is formed between the contract layers 121 and 122. The contact layers 121 and 112 are in contact to each other. Alternatively, as illustrated in the pixel 200 shown in FIG. 2, the adjacent contact layer 121 can be eliminated so that a single contract layer 112 is shared by the quantum-well stacks 110 and 120.

The material composition of a contact layer in general can be any suitable semiconductor material. Preferably, a contact layer may be selected according to the material composition of the respective quantum-well for lattice matching and easy fabrication. For example, if AlGaAs is used to form a quantum-well stack, a respective contact layer may be formed of heavily doped GaAs and the substrate may be formed of undoped GaAs which is semi-insulating.

The sensing pixel 100 receives input radiation from the side of the first quantum-well stack 110. The input radiation received by either quantum-well stack (110 or 120) must have an electric field component along the growth direction of the quantum-well layers which is perpendicular to the quantum-well layers in order to induce an intersubband transition at a desired infrared wavelength. See, Gunapala and Bandara, supra. For a single IR detector or a linear array, the substrate 101 may be lapped at an angle (e.g., 45°) to effect a proper coupling by directing the radiation perpendicular to the angled facet. Such a coupling configuration, however, cannot be used in a two-dimension sensing array.

One way to couple radiation at an angle to the quantum-well layers uses reflective gratings at each pixel (e.g., 100 or 200) to reflect normally incident radiation rays inside pixel 100 to produce reflective radiation rays having an electric field component along the growth direction of the quantum-well layers.

Referring to FIG. 1, the second quantum-well stack 120 is preferably smaller than the first quantum-well stack 100 to expose a portion of the contact layer 112 and to accommodate an electrode 140B. Two reflective grating layers 114 and 124 are respectively formed over the heavily doped contact layers 112 and 122 to provide proper optical coupling to the quantum-well sensing stacks 110 and 120. Such grating layers may be formed by using photolithographic techniques to fabricate desired grating features. The first reflective grating layer 114 may be configured to have grating features that reflect the radiation of the first wavelength $\lambda_1$ at one or more desired angles. The second reflective grating layer 124 may be fabricated to include two sets of reflective grating features, one set for reflecting radiation of the first wavelength $\lambda_1$ and another set for reflecting radiation of the second wavelength $\lambda_2$.

In operation, input radiation is received from the side of the sensing array that has the substrate 101. Incident rays in the input radiation that are substantially perpendicular to the array will not be absorbed by either of the quantum-well stacks 110 and 120. However, such rays will be reflected by the gratings 114 and 124 and re-enter the quantum-well stacks 110 and 120 from the opposite side at some angles and will be absorbed.

Electrical bias to each quantum-well sensing stack is provided through ohmic contacts. An ohmic contact 130B (e.g., a metallic layer) is formed on the first reflective grating layer 114 over the exposed portion of the contact layer 112. The electrode 140B, e.g., an indium bump, is formed over the ohmic contact 130B to supply a reference voltage $V_{REF}$ to the contact layers 112 and 121. Electrodes 140A, 140C are respectively formed on ohmic contacts 130A, 130C on the contact layers 111, 122 for providing a common bias voltage $V_{BIAS}$ to both quantum-well stacks 110 and 120. The electrodes 140A and 140C are shorted so that the voltage across each of the quantum-well stacks 110 and 120 is ($V_{BIAS}-V_{REF}$).

A readout multiplexer with an array of readout capacitors for sensing the radiation-induced charge is coupled to the two-band array to supply a single bias voltage ($V_{BIAS}$) to and to read out the signals from, both quantum-well stacks 110 and 120 in each pixel 100 or 200. Such readout multiplexer may be implemented by a commercial readout multiplexer used in a single-band quantum-well IR sensing array. This is well known in the art. One implementation designates one readout pixel in a readout multiplexer to one sensing pixel to read out the two signals from both stacks 110 and 120. The two signals from each sensing pixel may be read out sequentially: reading the stack 110 first and then reading the stack 120 after the capacitor is reset. Such operation can increase the frame readout time.

It is often desirable, however, to simultaneously measure the images of a target object at the two different wavelengths $\lambda_1$ and $\lambda_2$ in many applications. This may be done by simultaneously reading out the radiation-induced charged carriers from the stacks 110 and 120 in each pixel. One way to obviate this problem is to designate two readout pixels in the multiplexer array to one sensing pixel where one readout pixel corresponds to one sensing stack in the designated sensing pixel. Therefore, the two stacks 110 and 120 can be simultaneously read out by the two corresponding readout pixels in the multiplexer. Hence, for a sensing array of M pixels, a respective readout multiplexer should have 2M readout pixels. For example, two rows of the readout pixels in the multiplexer are designated to readout one row of the sensing pixels.

Each of the quantum-well stacks 110 and 120 is configured to operate based on a special "bound-to-quasi-bound" intraband transition (i.e., intersubband transition) to increase the responsivity and the signal-to-noise ratio. An absorption subband is described which occurs when the first excited state is in resonance with an area near the top of the barrier. Such transitions exist when the thermionic emission energy barrier of the quantum well ($E_T$) is substantially matched to the energy required for photoionization ($E_P$), i.e., preferably within 2% of precise resonance.

This bound-to-quasi-bound configuration has a thermionic emission energy barrier which is increased relative to the bound-to-continuum transitions. More thermal energy is required to liberate an electron confined in the quantum well. Dark current generated by the quantum well during operation is therefore reduced. However, since the excited state in the bound-to-quasibound configuration is resonant with the thermionic emission energy barrier, electrons can escape with little or no tunneling. The quantum wells with this configuration hence maintain a high quantum efficiency, i.e., a large amount of photocurrent is generated by the incident infrared photons. These two factors, low dark current and high quantum efficiency, increase the signal-to-noise ratio of the photocurrent generated by the quantum well.

The bound-to-quasibound energy-level configuration of the quantum wells in the stacks 110 and 120 is obtained by controlling the properties and quantities of the GaAs and $Al_xGa_{1-x}As$ materials to effect the necessary resonance relationship. The mole fraction of Al can be increased to increase the well depth. The thickness of the GaAs well layer can be decreased to increase the separation between the ground and excited state and the well depth. The preferred bound-to-quasibound configuration results when the photoionization ($E_P$) is substantially equal to the thermionic emission energy barrier. Under this condition, the excited state lies below the continuum states and above the deep confined quantum well states to form a quasi-bound state.

Since the excited state is near the barrier potential, electrons in the excited state can be easily pushed from this quasibound state into the continuum. An important advantage is that the photoexcited electrons can escape from the quantum well to the continuum transport states with little or no tunneling. This allows reduction of the bias required to efficiently collect the photoelectrons and hence reduces the dark current. Moreover, since the photoelectrons do not have to tunnel through thick barriers, the $Al_xGa_{1-x}As$ barrier thickness of the bound-to-continuum quantume-well devices can be increased without correspondingly reducing photoelectron collection efficiencies. This embodiment uses a barrier width is preferably 500 to 600 Å and the quantum well width which is preferably 40 to 70 Å. This is an increase of five over many conventional quantum-well IR detectors. See, the incorporated Application Ser. No. 08/785,350.

Figure 3:
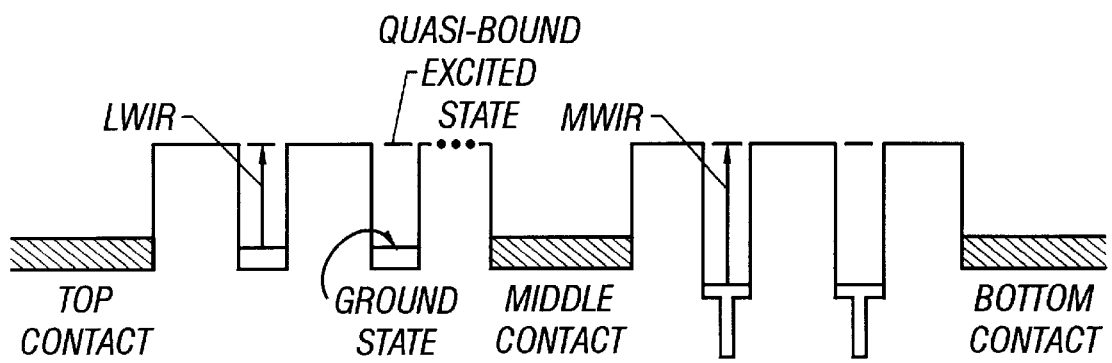
FIG. 3 is an energy-band diagram of a pixel shown in FIGS. 1 and 2 without the bias voltage.

Assume the first quantum-well stack 110 is configured as a MWIR detector and the second quantum-well stack 120 is configured as a LWIR detector in the pixel 100 or 200. The energy-band diagram of the pixel without an external bias can be illustrated in FIG. 3. Each quantum-well stack is configured so that the excited state in at or near the top the quantum well potential. A bias voltage is applied across a quantum-well stack preferably in a direction substantially perpendicular to the quantum-well layers to shift the radiation-induced charge in the excited state out of the quantum wells.

Figure 4:
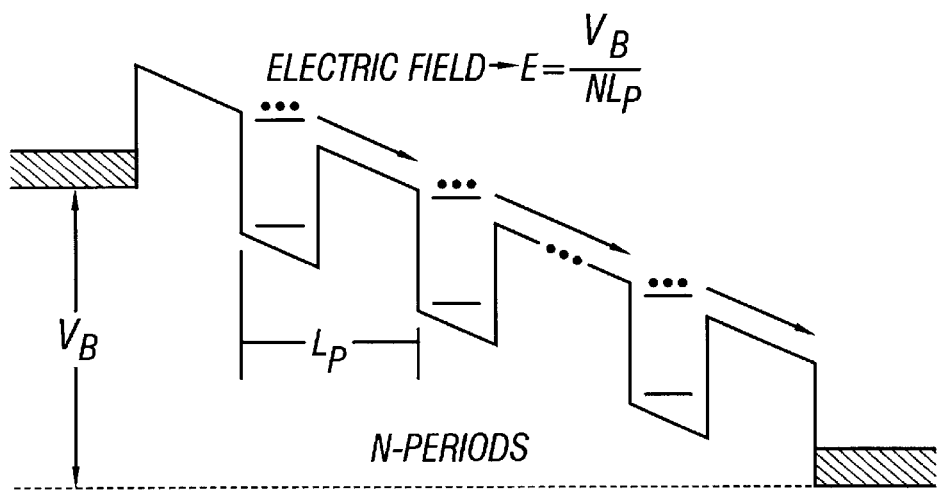
FIG. 4 is an energy-band diagram of a quantum-well IR detector under a bias voltage.

FIG. 4 shows the energy-band diagram of a quantum-well stack under a bias voltage across the quantum wells. The energy barrier between two adjacent quantum wells is slanted so that the radiation-induced charge in the excited state in one quantum well, under the force caused by the bias electric field, transports over the energy barrier to the adjacent quantum well with a lower electrical potential. Hence, this perpendicular bias voltage induces a large photocurrent in parallel to the bias electric field due to the large difference in the carrier mobility between the ground and excited states. In general, increasing the bias electric field can enhance the transport process of the radiation-induced charge, thereby increasing the output photocurrent.

However, the bias electric field cannot be too large since the dark current also increases with the bias electric field. The dark current is one primary source of noise in quantum-well IR detectors. When the bias electric field is greater than a certain value, the contribution from the dark current may become significant compared to the radiation-induced photocurrent so that the signal-to-noise ratio of the output photocurrent is degraded below a predetermined acceptable level. Therefore, the bias electric field should be properly selected to substantially optimize the responsivity while still maintaining the signal-to-noise ratio above the acceptable level.

Since the two quantum-well stacks 110 and 120 are configured to respond to radiation at two different wavelengths, the energy gaps between the ground and excited states in the two stacks are different. The quantum-well stack 110 for detecting radiation at a wavelength in the MWIR range has a larger energy separation between the respective ground and excited states in the same band than the quantum-well stack 120 for the LWIR range. Hence, a larger bias electric field is desired in the quantum-well stack 110 than that in the stack 120 in order to cause a significant transport of the radiation-induced carriers in both stacks and to respectively optimize the responsivities.

One feature of the pixel 100 or 200 is that the numbers of the quantum wells, the widths of each well, or both of the quantum-well stack 110 can be configured differently from those parameters of the stack 120 so that the same bias voltage can be applied to both stacks to achieve different bias electric fields within the stacks to substantially optimize their responsivities.

The responsivity, R, of a quantum-well stack can be approximately expressed in terms of the net quantum efficiency, η, of the stack and the photoconductive gain, g:

$$R = \left(\frac{e}{h\nu}\right)\eta g, \quad (1)$$

where e is the electronic charge and hν is the photoexcitation energy. When the quantum efficiency of each well $\eta_W$ is low ($\eta_W \ll 1$), the net quantum efficiency η and the photoconductive gain g are approximately given by:

$$\eta = \eta_W N, \quad (2)$$

$$g \approx \frac{1}{N p_c}, \quad (3)$$

where N is the number of quantum wells in the stack and $p_c$ is the capture probability of each well. Hence, the responsivity R of the stack is $$R \approx \left(\frac{e}{h\nu}\right)\frac{\eta_W}{p_c}. \quad (4)$$

Hence, the responsivity R of a stack is approximately independent of the number of the wells, N. The dependence of the responsivity R on the bias electric field across each well is primarily caused by the variation of $p_c$ with the bias electric field. The capture probability $p_c$ decreases as the bias electric field increases and vice versa.

Assume the desired bias electric fields for the stacks 110 and 120 are $E_{B1}$ and $E_{B2}$, respectively. The relation between the common bias voltage difference ($V_B - V_0$) and the optimized bias electric fields $E_{B1}$ and $E_{B2}$ is $$V_B - V_0 = E_{B1} N_1 L_{P1} = E_{B2} N_2 L_{P2}, \quad (5)$$

where $N_1$ and $N_2$, $L_{P1}$ and $L_{P2}$ are the numbers of quantum wells, and the well widths of the stacks 110 and 120, respectively. Therefore, as long as the number of the wells, N, and the well width, Lp, of a quantum well are configured to maintain the parameter, ENLp, as a constant (i.e., the common voltage difference between each stack), the bias electric fields and therefore the responsivities of the two quantum-well stacks are set at the desired values. When the two quantum-well stacks 110 and 120 have the same well width, the ratio of the numbers of wells of the stacks 110 and 120 is selected to satisfy the following:

$$\frac{N_1}{N_2} = \frac{E_{B2}}{E_{B1}}. \quad (6)$$

Since $E_{B1} > E_{B2}$, the number of wells $N_1$ in the stack 110 is less than the number of wells $N_2$ in the stack 120.

The dark current noise associated with the dark current $I_D$ of a quantum-well stack can be approximately expressed as $$i_n = \sqrt{4eg I_D \Delta f} = \sqrt{\frac{4e I_D \Delta f}{N p_c}}, \quad (7)$$

where Δf is the frequency bandwidth. For a common number of wells, the value of $I_D/p_c$ for a LWIR detector is usually a few orders greater than that of the a SWIR or MWIR detector, the dark current noise of a dual-band pixel 100 or 200 is dominated by the LWIR detector. When the number of wells in the LWIR detector increases and the number of the wells in the SWIR or MWIR detector decreases, the dark current noise in the LWIR detector decreases while the dark current noise in the SWIR or MWIR detector increases. However, for many practical devices, the dark current noise of the LWIR detector still dominates when the quantum-well stacks 110 and 120 are configured according to Equation (5) or (6). Hence, the dark current noise of the dual-band pixel 100 or 200 with $N_1 < N_2$ under a single bias voltage can be reduced compared to the dark current noise of a dual-band pixel with $N_1 = N_2$ under two bias voltages.

The doping density of the quantum wells, $n_D$, of the each quantum-well stack (110 or 120) is another design parameter that can be varied to optimize the performance of the sensing array. The doping density $n_D$ directly relates to the single well quantum efficiency $\eta_W$. Therefore, the responsivity R in equation (4) is directly proportional to $n_D$. The doping densities of the two quantum-well stacks 110 and 120 can be set at different values so that their respective responsivities are different from each other.

For example, in certain applications, the amount of IR radiation at the first operating wavelength $\lambda_1$ of the first stack 110 is different from the amount of IR radiation at the second operating wavelength $\lambda_2$ of the second stack 120 in an received image. It therefore may be necessary to make the responsivity of the stack that receives the weaker radiation higher than the other stack by a higher doping density so that the received image represented by the weaker radiation can be enhanced.

Specifically, assuming that two different fluxes at different wavelengths received in the two different sensing stacks are $f_1$ and $f_2$, the photocurrents respectively generated by the stacks 110 and 120, $i_1$ and $i_2$, can be written as:

$$i_1 = f_1 \times R_1,$$

$$i_2 = f_2 \times R_2,$$

where $R_1$ and $R_2$ are responsivities of the stacks 110 and 120, respectively and are defined in Eq.(4). If the current $i_1$ and $i_2$ are significantly different from each other, e.g., the difference is greater than one order of magnitude, due to the difference in $f_1$ and $f_2$, the readout multiplexer array may not properly detect the current signals $i_1$ and $i_2$. For some readout multiplexers, it is desirable to have the values of $i_1$ and $i_2$ on the same order of magnitude. This can be achieved by adjusting the quantum efficiency of each well $\eta_W$, which is directly related to the number of carriers, i.e., well doping density, in the well. Hence, this well doping density can be used as another design parameter to adjust the quantum efficiency of each well and to optimize the sensing array according to specific requirements of an application. Other parameters, including, the number of wells and the quantum well period, may also be adjusted to change the electric field in each well. The electric field in each well changes the capture probability pc. Therefore, the doping density, number of wells and quantum well period of the quantum-well sensing stacks 110 and 120 can all be adjusted in a relation with one another so that the two sensing stacks produce photocurrents of similar magnitudes in response to radiation of different fluxes at two different wavelengths.

In general, the number of quantum wells N, the quantum well width $L_p$, and the doping density $n_D$, can be adjusted either independently or in combination to provide design flexibility and to meet the performance requirements of various applications.

Figure 2:
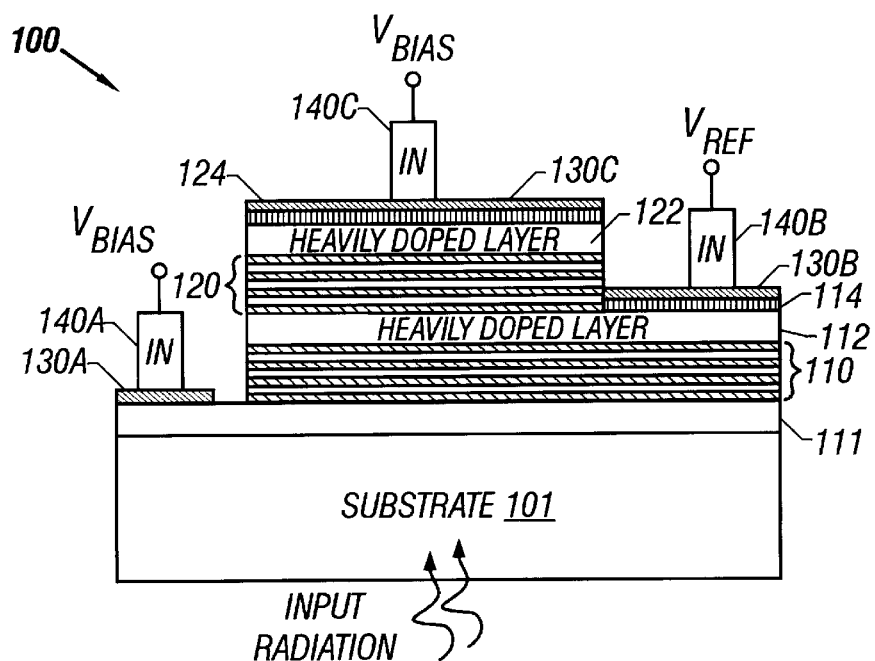
FIG. 2 shows another embodiment of a pixel for a dual-band quantum-well IR sensing array wherein each pixel has two quantum-well IR detectors with different numbers of wells and operates under a single external bias voltage.
Figure 5:
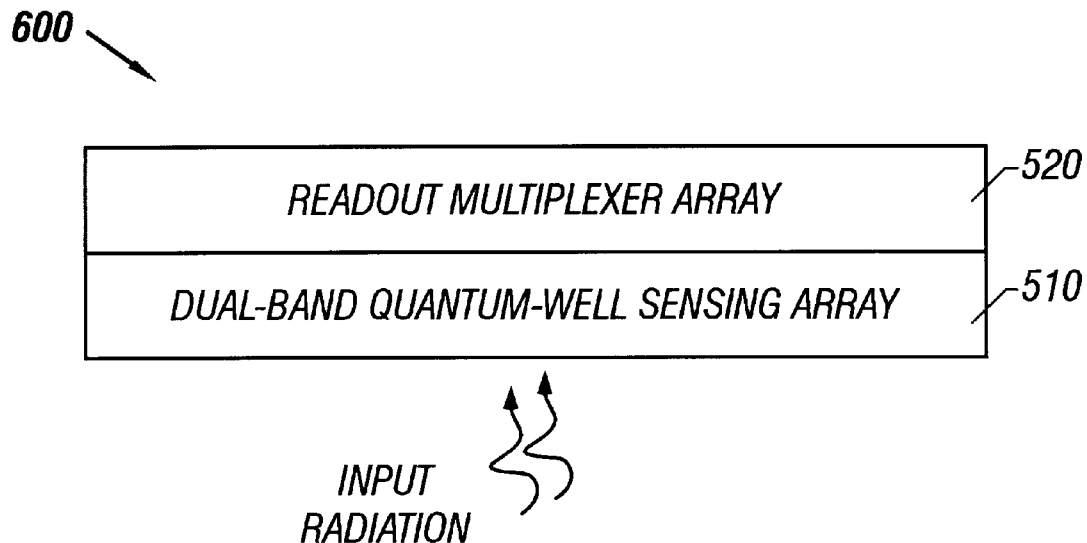
FIG. 5 shows a dual-band sensing device formed of a dual-band sensing array and a readout multiplexer array with single bias voltage.

FIG. 5 shows that a dual-band quantum-well sensing array 510 having pixels shown in either FIG. 1 or in FIG. 2 is engaged to a readout multiplexer array 520. The indium bumps (e.g., 140A through 140C in FIG. 1) in each pixel are connected to the respective pixel in the readout multiplexer array 520.

Figure 6:
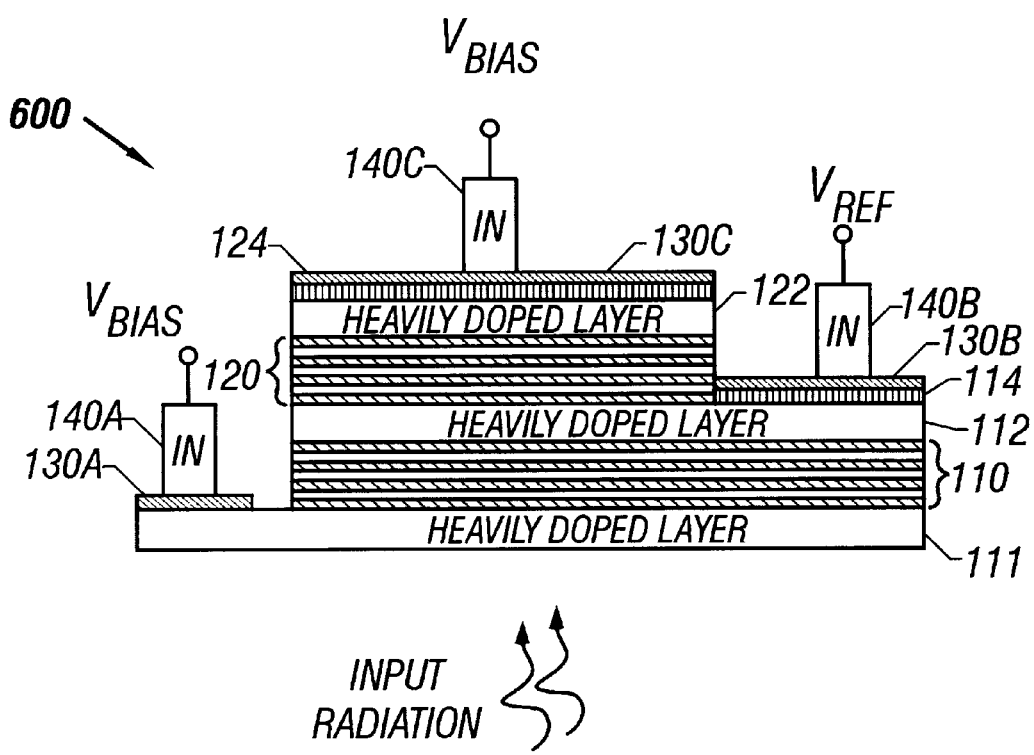
FIG. 6 shows a dual-band pixel without a substrate.

The substrate 101 shown in FIGS. 1 and 2 may be eliminated by, e.g., etching, to achieve certain performance advantages. FIG. 6 shows one embodiment of a dual-band quantum-well sensing pixel without a substrate. The support for the sensing pixels is provided by the readout multiplexer array 520. Since the multiplexer array 520 is in general formed of a silicon substrate which is different from the substrate 101 (e.g., GaAs), the thermal expansion coefficients of the multiplexer array 520 and the sensing array 510 with the substrate 101 are different. Different thermal contractions occur when the device is cooled down to a low temperature and may cause cracking.

Although dual-band quantum-well IR sensing arrays are described, three or more quantum-well IR detectors at different wavelengths may be implemented each pixel to form a multi-band quantum-well IR sensing array. Also, in an alternate embodiment, each reflective grating layer (114 and 124) may be replaced by a special reflecting layer which has surface roughness or small features (either random or periodic) on the scale of the wavelength. Normally incident radiation, upon reflection by such a reflecting layer, is scattered back to the sensing stacks 110 and 120 in a range of directions (e.g., forming a cone) and is no longer perpendicular to the quantum-well layers. Various other modifications and enhancements may also be made, which are intended to be encompassed by the appended claims.

What is claimed is:

1. A semiconductor radiation sensing array comprising a plurality of sensing pixels formed on a semiconductor substrate, each sensing pixel including:

a first semiconductor contact layer doped to have a predetermined type of conductivity;

a first quantum-well sensing stack formed over said first semiconductor contact layer and configured to have a plurality of alternating semiconductor layers which form a first number of quantum wells of a first well width and are doped at a first doping level, said first quantum-well sensing stack responsive to radiation at a first operating wavelength to produce a first amount of charged carriers;

at least one second semiconductor contact layer doped to have said predetermined type of conductivity and formed on said first quantum-well sensing stack;

a second quantum-well sensing stack formed over said second semiconductor contact layer and configured to have a plurality of alternating semiconductor layers which form a second number of quantum wells of a second well width and are doped at a second doping level, said second quantum-well sensing stack responsive to radiation at a second operating wavelength different than said first operating wavelength to produce a second amount of charged carriers;

a third semiconductor contact layer doped to have said predetermined type of conductivity and formed on said second quantum-well sensing stack, wherein said first and third semiconductor contact layers are maintained at a common bias electrical potential with respect to said second semiconductor contact layer so that said first and second quantum-well sensing stacks are biased by a common voltage difference.

2. The array as in claim 1, wherein said first and second quantum-well sensing stacks operate based on intraband transitions.

3. The array as in claim 2, wherein said first operating wavelength is longer than said second operating wavelength, said first well width is substantially equal to said second well width, and said first quantum-well sensing stack has less quantum wells than said second quantum-well sensing stack.

4. The array as in claim 1, wherein at least one of said first and second quantum-well sensing stacks includes $Al_xGa_{1-x}As/GaAs$, $Al_{1-x}Ga_{1-x}As/In_yGa_{1-y}As/GaAs$, $Ga_xIn_{1-x}P/InP$, GaAs, InP, $Al_xIn_{1-x}P/InP$, or $In_xAl_{1-x}As/AlAs$, where x and y represent relative molar ratios.

5. The array as in claim 1, further comprising a readout multiplexer array having readout capacitors, wherein said readout multiplexer array is electrically coupled to simultaneously produce a first output signal indicative of said first amount of charged carriers in said first quantum-well sensing stack from each sensing pixel and a second output signal indicative of said second amount of charged carriers in said second quantum-well sensing stack from each sensing pixel.

6. The array as in claim 1, wherein said first and second quantum-well sensing arrays are so configured by adjusting respective numbers of wells, widths of wells, and doping levels of wells in accordance with an intensity difference between energy at said first operating wavelength and energy at said second operating wavelength that said first amount of charged carriers and second amount of charge carriers are within same order of magnitude from each other.

7. The array as in claim 1, further comprising a radiation-reflective layer formed over said third semiconductor contact layer and configured to reflect radiation rays that are substantially perpendicular to said third semiconductor contact layer to produce reflected radiation rays having polarization components parallel to said third semiconductor contact layer.

8. The array as in claim 7, wherein said radiation-reflective layer includes a reflective grating having a first set of grating features for reflecting radiation at said first operating wavelength and a second set of grating features for reflecting radiation at said second operating wavelength.

9. The array as in claim 2, wherein each quantum-well sensing stack is configured to place the excited state near the barrier potential of each quantum well so that the thermionic emission energy barrier of the quantum well is substantially matched to the photoionization energy that is defined by the potential difference between the ground state and the excited state of a intraband transition.

10. The array as in claim 9, wherein each quantum-well sensing stack is configured in such a way that the respective thermionic emission energy barrier of the quantum well is within 2% of the photonionization energy.

11. A semiconductor radiation sensing array comprising a plurality of sensing pixels formed on a semiconductor substrate, each sensing pixel including:

a first semiconductor contact layer doped to have a predetermined type of conductivity;

a first quantum-well sensing stack formed over said first semiconductor contact layer and configured to have a plurality of quantum-wells formed of alternating semiconductor layers and responsive to radiation at a first operating wavelength to produce a first amount of charged carriers;

at least one second semiconductor contact layer doped to have said predetermined type of conductivity and formed on said first quantum-well sensing stack, said second semiconductor contact layer having a first portion and a second portion;

a second quantum-well sensing stack formed over said first portion of said second semiconductor contact layer and configured to have a plurality of quantum wells formed of alternating semiconductor layers and responsive to radiation at a second operating wavelength different than said first operating wavelength to produce a second amount of charged carriers;

a first radiation-reflective layer formed over said second portion of said second semiconductor contact layer;

a third semiconductor contact layer doped to have said predetermined type of conductivity and formed on said second quantum-well sensing stack; and a second radiation-reflective layer formed over said third semiconductor contact layer, wherein said first and third semiconductor contact layers are maintained at a common bias electrical potential with respect to said second semiconductor contact layer so that said first and second quantum-well sensing stacks are biased by a common voltage difference.

12. The array as in claim 11, wherein said first and second quantum-well sensing stacks operate based on intraband transitions.

13. The array as in claim 11, wherein at least one of said first and second quantum-well sensing stacks includes $Al_xGa_{1-x}As/GaAs$, $Al_{1-x}Ga_{1-x}As/In_yGa_{1-y}As/GaAs$, $Ga_xIn_{1-x}P/InP$, GaAs, InP, $Al_xIn_{1-x}P/InP$, or $In_xAl_{1-x}As/AlAs$, where x represents a relative molar ratio.

14. The array as in claim 11, further comprising a readout multiplexer array having readout capacitors, wherein each pixel of said readout multiplexer array is electrically coupled to a corresponding sensing pixel and respectively produces a first output signal indicative of said first amount of charged carriers in said first quantum-well sensing stack and a second output signal indicative of said second amount of charged carriers in said second quantum-well sensing stack.

15. The array as in claim 11, wherein said first and second quantum-well sensing stacks are so configured by adjusting respective numbers of wells, widths of wells, and doping levels of wells in accordance with an intensity difference between energy at said first operating wavelength and energy at said second operating wavelength that said first amount of charged carriers and second amount of charge carriers are within same order of magnitude from each other.

16. The array as in claim 11, wherein said first radiation-reflective layer includes a first reflective grating operable to reflect normally incident radiation rays at said first operating wavelength to one or more desired directions and said second radiation-reflective layer includes a second reflective grating having a first set of grating features for reflecting radiation at said first operating wavelength and a second set of grating features for reflecting radiation at said second operating wavelength.

17. The array as in claim 11, wherein said first radiation-reflective layer includes reflective surface features of about said first operating wavelength and said second radiation-reflective layer includes reflective surface features of about said first and second operating wavelengths.

18. A method for constructing and using a semiconductor radiation sensing array to detect radiation having at least two wavelengths, comprising:

forming a first quantum-well sensing stack and a second quantum-well sensing stack in a sensing pixel to respectively detect radiation at a first operating wavelength and radiation at a second operating wavelength, wherein said first and second quantum-well sensing stacks have different number of quantum wells; and applying a common bias electrical voltage to both said first and second quantum-well sensing stacks to produce first and second photocurrents that respectively represent intensities at said first and second operating wavelengths in the received radiation.

19. The method as in claim 18, further comprising selecting respective numbers of wells, widths of wells, and doping levels of wells of said first and second quantum-well sensing stacks according to an intensity difference between energy at said first operating wavelength and energy at said second operating wavelength so that said first and second photocurrents are within same order of magnitude from each other.

20. The method as in claim 18, further comprising configuring each quantum-well sensing stack to place the excited state near the barrier potential of each quantum well so that the thermionic emission energy barrier of the quantum well is substantially matched to the photoionization energy that is defined by the potential difference between the ground state and the excited state of a intraband transition.

* * * * *